US008237483B2

(12) United States Patent
Gupta et al.

(10) Patent No.: US 8,237,483 B2
(45) Date of Patent: Aug. 7, 2012

(54) PROCESSING CLOCK SIGNALS

(75) Inventors: Nitin Gupta, Haryana (IN); Nitin Jain, Ghaziabad (IN)

(73) Assignee: STMicroelectronics International N.V., Amsterdam (NL)

( * ) Notice: Subject to any disclaimer, the term of this patent is extended or adjusted under 35 U.S.C. 154(b) by 35 days.

(21) Appl. No.: 12/982,593

(22) Filed: Dec. 30, 2010

(65) Prior Publication Data

US 2012/0169393 A1 Jul. 5, 2012

(51) Int. Cl.
*H03K 3/00* (2006.01)
(52) U.S. Cl. ......... 327/291; 327/170; 327/210; 327/292
(58) Field of Classification Search .......... 327/108–112, 327/170–172, 291–292, 199–201, 207–211, 327/214–215
See application file for complete search history.

(56) References Cited

U.S. PATENT DOCUMENTS 5,341,048 A * 8/1994 Randhawa et al. ............. 326/95
6,624,670 B2 * 9/2003 Payne et al. ................... 327/108

* cited by examiner

*Primary Examiner* — An Luu
(74) *Attorney, Agent, or Firm* — Wolf, Greenfield & Sacks, P.C.

(57) ABSTRACT

A circuit for processing a clock signal including first and second clock edges of different polarities, the circuit including an inverter for inverting a first clock edge to generate an inverted first clock edge and inverting a second clock edge to generate an inverted second clock edge; a first pass gate for receiving the inverted clock edge and outputting a first trigger signal of a first polarity; and a second pass gate for receiving the second clock edge and outputting a second trigger signal of the first polarity, wherein the second pass gate is controlled to open responsive to the inverted second clock edge; whereby the delay between the first clock edge and the first trigger signal is substantially equal to the delay between the second clock edge and second trigger signal.

14 Claims, 4 Drawing Sheets

PROCESSING CLOCK SIGNALS

BACKGROUND OF THE INVENTION

1. Field of the Invention

The present application relates to methods and circuitry for processing clock signals.

2. Discussion of the Related Art

Clock signals are typically used in electrical circuits to regulate the timing of the operations of the circuit. A clock signal has periodic transitions (at least one of rising or falling edges) which are spaced apart by the same interval, such that operations can be carried out in the circuit in accordance with the timing of the transitions of the clock signal.

Double edge clocking is a technique for speeding up switching in logic circuits. The circuit shown in FIG. 1 is one example of a circuit 100 that uses both edges of a clock signal (both falling and rising edges) to trigger the circuit.

Circuit 100 comprises two DQ flip-flops 101 and flip-flop 102 wherein the output Q of flip-flop 101 is connected to the data input D of flip-flop 102 via a combinatory logic block 104. The block 104 represents logic for processing the Q outputs of the flip flop 101 before applying it to the D input of flip flop 102.

The DQ flip-flops 101, 102 each have a clock input CP which is activated on a rising edge. When the clock signal has a rising edge, the rising edge presented at the CP input of flip-flop 102 will activate it. The clock signal is also input to inverter 103 which inverts the clock signal so that a falling edge is input into the CP input of the flip-flop 101, failing to activate it. When the clock signal has a falling edge, it is inverted by inverter 103 so that a rising edge activates the CP input of the flip-flop 101.

Using both edges of a clock signal (both falling and rising edges) to trigger a circuit can be problematic. The interval between the rising and falling edges is constant, but the delay created by the inverter 103 applied to the clock signal can cause the "inverted" rising edge to be delayed, causing triggering differences which for example can lead to a reduced margin in the circuit being triggered.

SUMMARY OF THE INVENTION

It is an aim of at least one embodiment of the present invention to provide a method and circuit for processing a clock signal so that both rising and falling edges can be used as timing signals, while minimising triggering differences.

According to one aspect of the present invention, there is provided a circuit for processing a clock signal including first and second clock edges of different polarities, the circuit comprising: an inverter for inverting a first clock edge to generate an inverted first clock edge and inverting a second clock edge to generate an inverted second clock edge; a first pass gate for receiving the inverted clock edge and outputting a first trigger signal of a first polarity; and a second pass gate for receiving the second clock edge and outputting a second trigger signal of the first polarity, wherein the second pass gate is controlled to open responsive to the inverted second clock edge; whereby the delay between the first clock edge and the first trigger signal is substantially equal to the delay between the second clock edge and second trigger signal.

In one embodiment, the first and second pass gates each comprise a PMOS transistor and an NMOS transistor connected in parallel.

In one embodiment, the gate terminal of the PMOS transistor of the first pass gate is connected to receive a first voltage level, the gate terminal of the NMOS transistor is connected to receive a second voltage level, the gate terminal of the PMOS transistor of the second pass gate is supplied with the output of said inverter and the gate terminal of the NMOS transistor of the second pass gate is connected to the second voltage level.

In one embodiment, the first clock edge is a falling edge and the second clock edge is a rising edge, the first and second trigger signals are rising edges.

In one embodiment, the circuit further comprises buffer circuitry configured to supply the clock signal to said inverter.

In one embodiment, the circuit further comprises buffer circuitry configured to receive the first trigger signal and an even number of inverters configured to receive the second trigger signal.

In one embodiment, the buffer circuitry comprises an even number of inverters.

In one embodiment, said delay is in the order of picoseconds.

In one embodiment, the gate terminal of the NMOS transistor of the second pass gate is supplied with the output of said inverter and the gate terminal of the PMOS transistor of the second pass gate is connected to the first voltage level.

In one embodiment, rising edges of the first and second trigger signals may be matched by removing an inverter from the buffer circuitry at the input and at the output.

According to another aspect of the present invention, there is provided a method of processing a clock signal including first and second clock edges of different polarities, the method comprising: inverting a first clock edge to generate an inverted first clock edge and passing the inverted clock edge through a first pass gate to output a first trigger signal of a first polarity; inverting a second clock edge to generate an inverted second clock edge; and supplying the second clock edge to a second pass gate to output a second trigger signal of the first polarity, wherein the second pass gate is controlled to open responsive to the inverted second clock edge; whereby the delay between the first clock edge and the first trigger signal is substantially equal to the delay between the second clock edge and the second trigger signal.

In one embodiment, the first polarity is the same as the polarity of the second clock edge.

In one embodiment, the first polarity is the same as the polarity of the first clock edge.

BRIEF DESCRIPTION OF THE DRAWINGS

For a better understanding of the present application and as to how the same may be carried into effect, reference will now be made by way of example to the accompanying drawings in which.

DETAILED DESCRIPTION

Figure 1:
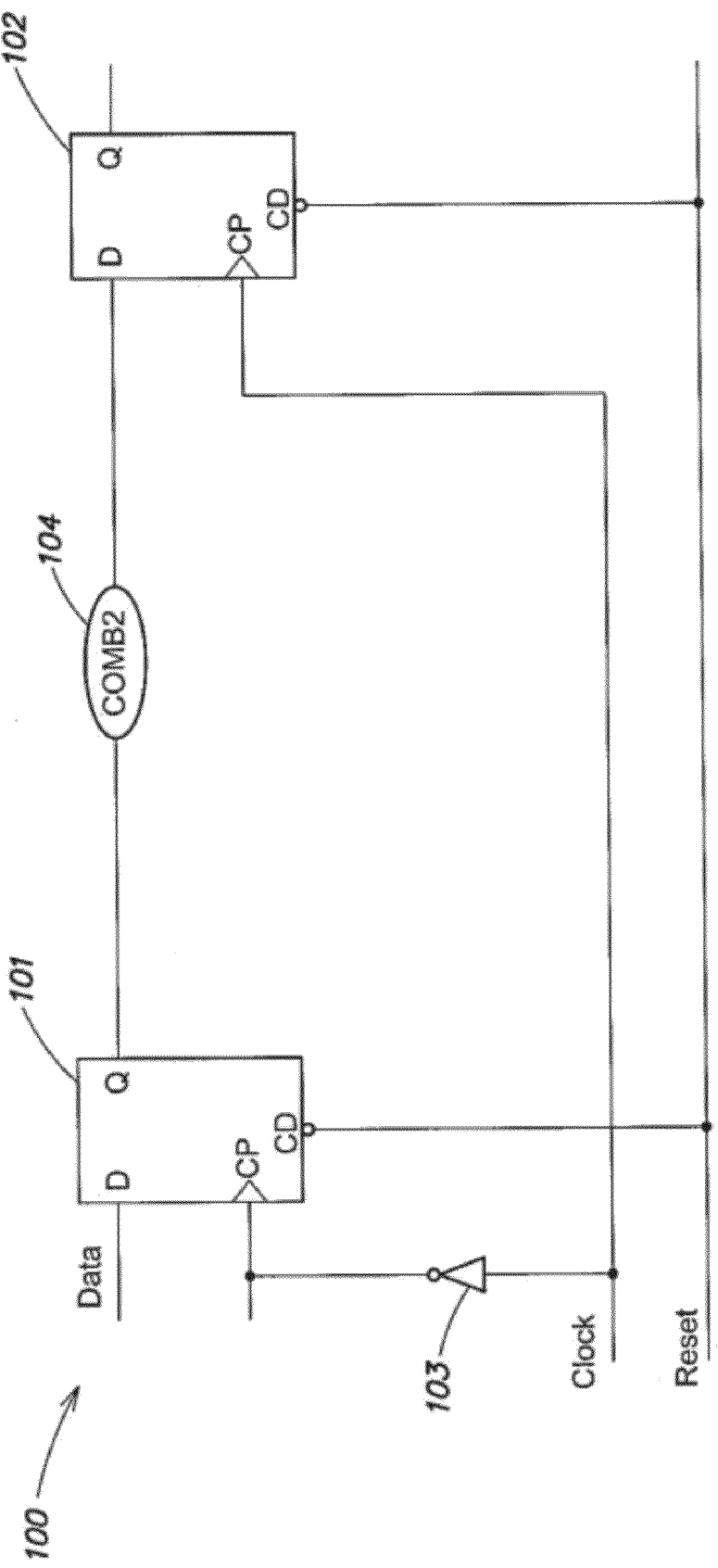
FIG. 1 shows a circuit which requires matched trigger signals.
Figure 2:
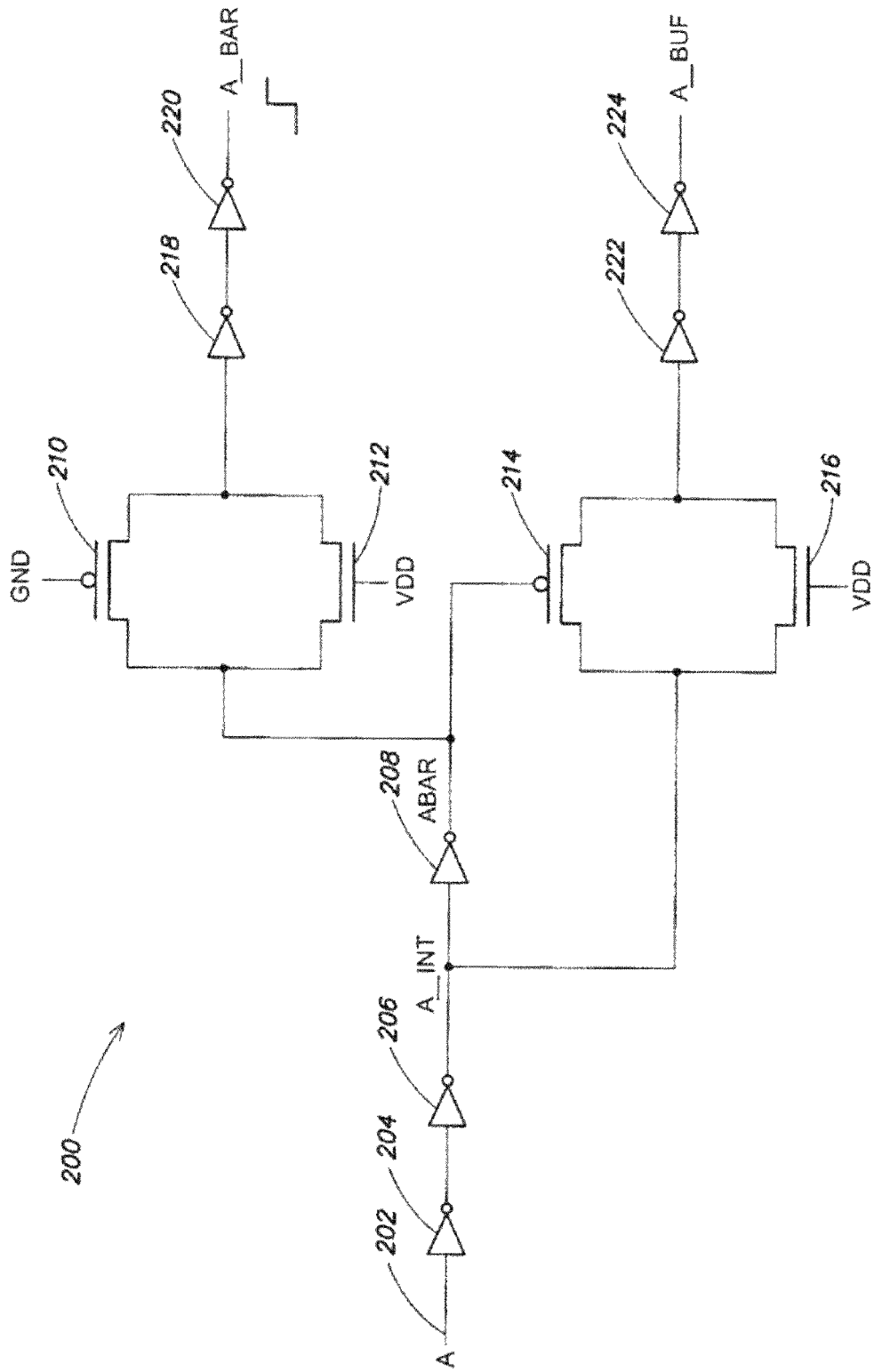
FIG. 2 shows a circuit for providing matched rising clock edge trigger signals.

Reference is now made to FIG. 2, which shows circuit 200 in accordance with one embodiment of the present invention. The circuit 200 comprises an input line 202 coupled to an input of inverter 204. The output of inverter 204 is coupled to the input of inverter 206. In operation the clock signal A is an input to the circuit 200 on input line 202. Inverters 204 and 206 invert, then re-invert, the current logical state of the clock signal. As shown in FIG. 2 the output of inverter 206 is labelled "A_INT". Circuit 200 has a non-inverted path and an inverted path.

On the inverted path, A_INT is input to inverter 208. As shown in FIG. 2 the output of inverter 208 is labelled "ABAR". Inverter 206 is needed to match the slope of A_INT and ABAR. The signal ABAR is supplied to a first pass gate comprising CMOS transistors 210, 212. ABAR is input to the source terminals of the transistors 210 and 212. The gate of transistor 210 is connected to ground. The gate of transistor 212 is connected to a supply voltage Vdd. The drain terminals of transistors 210 and 212 are coupled together at an output node connected to the input of inverter 218. The output of inverter 218 is coupled to the input of inverter 220. The inverters 218,220 invert then re-invert, the current logical state of the clock signal to perform the function of a buffer and output a first trigger signal labelled "A_BAR".

On the non-inverted path, A_INT is supplied to a second pass gate comprising CMOS transistors 214, 216. A_INT is input to the source terminals of transistors 214 and 216. The gate of transistor 216 is connected to the supply voltage Vdd. The output of inverter 208 (ABAR) is coupled to the gate of transistor 214. The drain terminals of transistors 214 and 216 are coupled together at an output node connected to the input of inverter 222. The output of inverter 222 is coupled to the input of inverter 224. Inverters 222 and 224 invert, then re-invert, the current logical state of the clock signal to perform the function of a buffer and output a second trigger signal labelled "A_BUF". The inverters 218, 220, 222, 224 are used to match the slope of the output signals A_BAR and A_BUF, as the slopes of the signals at the outputs of the first and second pass gates are different.

The operation of the pass gates will now be described. Transistors 210 and 212 are pass transistors. In the described embodiment, each pass transistor is a MOSFET (metal-oxide-semiconductor field-effect transistor) with a control input applied to its gate terminal and the signal to be passed applied to the source terminal.

This arrangement of pass transistors 210,212 and pass transistors 214,216 is commonly known as a "pass gate" or "transmission gate".

Normally, a pass gate is made by the parallel combination of an n-channel MOSFET (NMOS) and a p-channel MOSFET (PMOS) with the input at the gate of one transistor being complementary to the input at the gate of the other such that both transistors are either ON or OFF. However, in the circuit described herein, in the first pass gate, pass transistor 210 is a PMOS transistor and pass transistor 212 is an NMOS transistor. The gate terminal of PMOS transistor 210 is connected to ground, therefore a logic '0' is continuously supplied to the gate of PMOS transistor 210 and the PMOS transistor 210 is always on. The gate terminal of NMOS transistor 212 is connected to the supply voltage "Vdd"; therefore a logic '1' is continuously supplied to the gate of NMOS transistor 212 and therefore NMOS transistor 212 is always on.

As the gate inputs of PMOS transistor 210 and NMOS transistor 212 are continuously supplied with logic '0' and '1' respectively the ABAR signal will be passed through the first pass gate to the inverters 218, 220.

In the second pass gate, pass transistor 214 is a PMOS transistor and pass transistor 216 is an NMOS transistor. PMOS transistor 214 receives, at its gate terminal, the ABAR signal that is output from inverter 208. The gate terminal of NMOS transistor 216 is connected to the supply voltage "Vdd"; therefore a logic '1' is continuously supplied to the gate of NMOS transistor 216 and therefore NMOS transistor 216 is always on.

The operation of the circuit of FIG. 2 will now be further described with reference to the timing diagram shown in FIG. 3.

Figure 3:
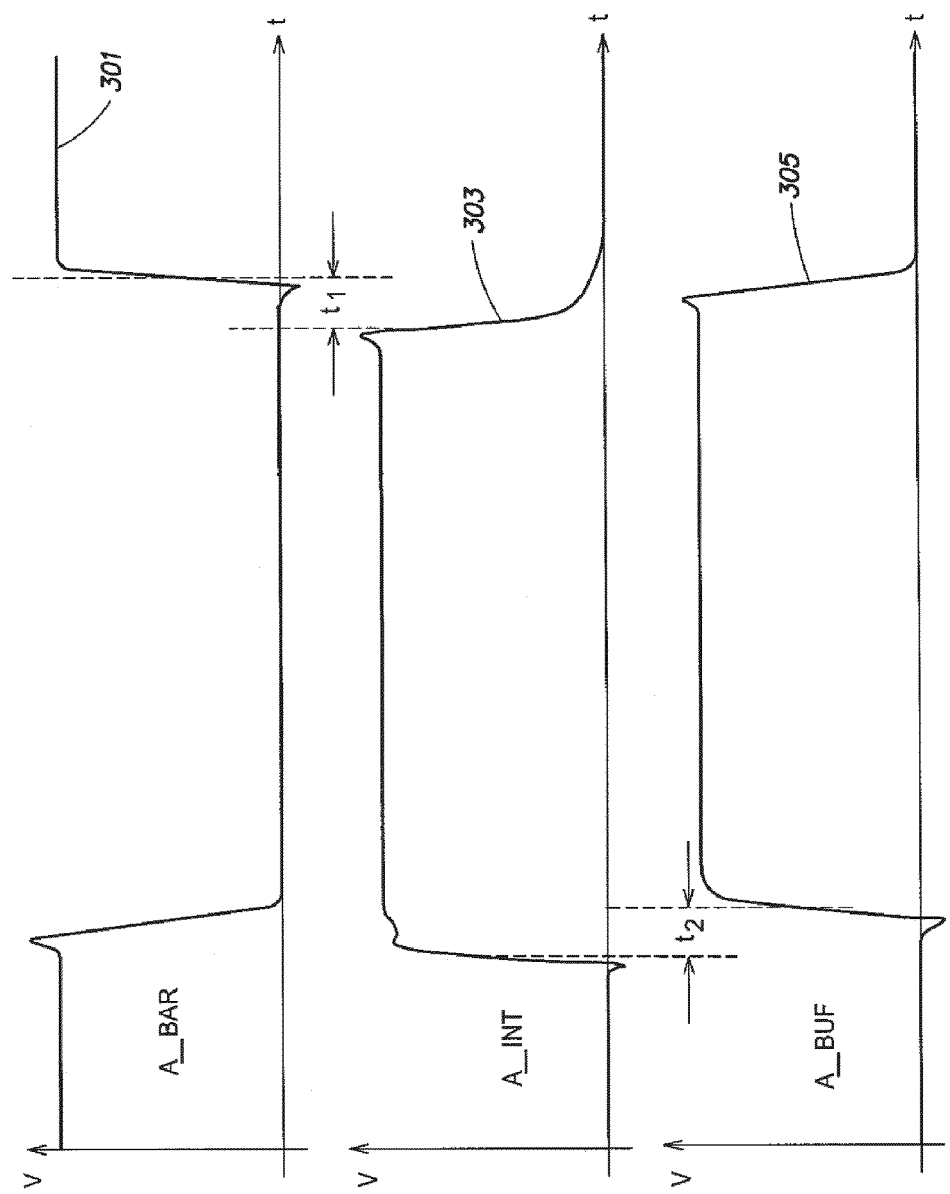
FIG. 3 shows a timing diagram corresponding to the circuit of FIG. 2.

FIG. 3 shows the signal waveforms for the first trigger signal (A_BAR) 301, the signal at the output of inverter 206 (A_INT) 303 which corresponds to the input signal (A), and the second trigger signal (A_BUF) 305.

On the right hand side of FIG. 3, a falling clock edge of the signal A_INT 303 generates the first trigger signal (A_BAR) 301 as shown. A falling clock edge on the signal A_INT 303 causes a rising clock edge on the signal ABAR due to the inverter 208. The signal ABAR is output as the first trigger signal A_BAR 301. However the rising clock edge on the signal A_BAR 301 does not occur instantaneously due to a delay $t_1$ on the inverted path caused by the inverters 208, 218 and 220. As shown in FIG. 3 the delay $t_1$ occurs between the falling clock edge of the signal A_INT 303 and the rising clock edge on the second trigger signal A_BAR 301. In one embodiment the delay is 189 ps.

On the left hand side of FIG. 3, a rising clock edge of the signal A_INT 303 generates the second trigger signal (A_BUF) 305 as shown. A rising clock edge of the signal A_INT 303 is supplied to the second pass gate 214, 216. The high level of A_INT will not be sufficiently passed by the NMOS transistor (even though it is on) because there is insufficient voltage differential between source and gate terminal. The inverter 208 inverts the rising clock edge of the signal A_INT 303 to output a falling clock edge signal on the signal ABAR. The falling clock edge on the signal ABAR turns the PMOS transistor 214 ON and allows the rising clock edge of the signal A_INT 303 to pass completely through transistors 214 and 216 and be output as the second trigger signal A_BUF 305. It will be apparent that the rising clock edge on the signal A_BUF 305 does not occur simultaneously with the rising clock edge of A_INT, because it has been blocked by the second pass gate for a delay caused by inverter 208. As shown in FIG. 3 a delay $t_2$ on the non-inverted path (caused by inverters 208, 222 and 224) occurs between the rising clock edge of the signal A_INT 303 and the rising clock edge on the second trigger signal A_BUF 305. Consequently, the delay ($t_1$) between a falling input clock edge and a rising clock edge on the first trigger signal A_BAR is substantially equal to the delay ($t_2$) between a rising input clock edge and a rising clock edge on the second trigger signal A_BUF. In the embodiment, both delays are 189 ps.

Note that when the signal A_INT 303 falls, the PMOS transistor 214 remains on for a short period (the delay of the inverter 208), allowing the low level of A_INT 303 to pass on the output A_BUF 305. That is, the falling edge of A_BUF 305 is almost simultaneous with the falling edge of A_INT. Then, the inverter 208 generates A_BAR 301 at a high level which turns PMOS transistor 214 off again.

Whilst the operation of the circuit shown in FIG. 2 has been described in relation to providing matched rising clock edge trigger signals, the circuit shown in FIG. 2 may also provide matched falling clock edge trigger signals by way of a simple circuit modification.

To provide matched falling clock edge trigger signals the pass transistor 214 is an NMOS transistor with the ABAR signal supplied to the gate terminal of NMOS transistor 214 and the A_INT signal supplied to the source terminal of NMOS transistor 214. Pass transistor 216 is a PMOS transistor with its gate terminal connected to ground therefore a logic '0' is permanently supplied to the gate of PMOS transistor 216

In this circuit configuration, a delay ($t_3$) between a rising input clock edge A and a falling clock edge on the first trigger signal A_BAR is substantially equal to a delay ($t_4$) between a falling input clock edge A and a falling clock edge on the second trigger signal A_BUF.

This circuit modification may also be used for matching rising edges by removing one of the inverters from the buffer circuitry at both the input and output. For example by removing inverters 204, 218, and 222.

Figure 4:
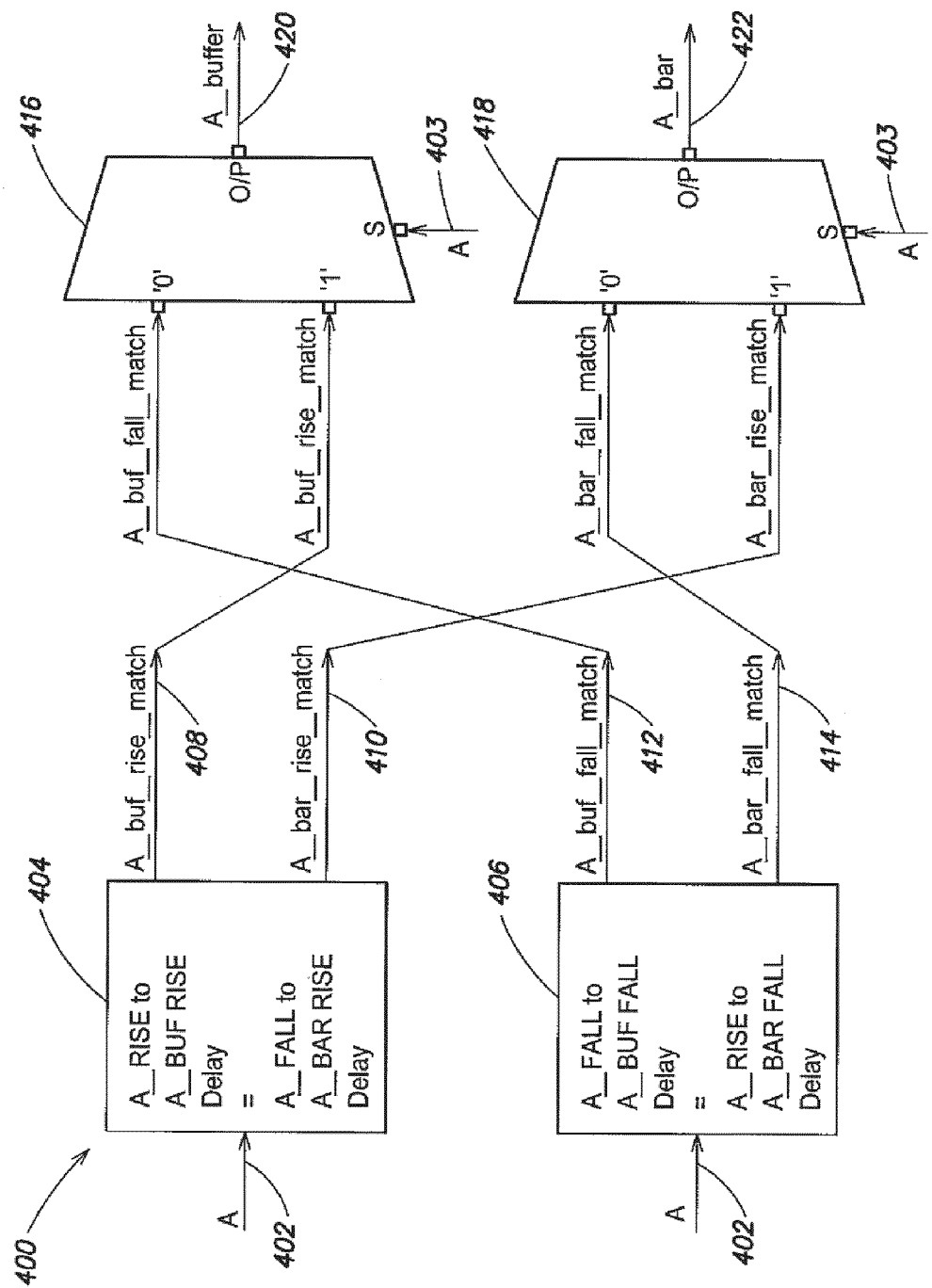
FIG. 4 shows a possible architecture for fully balanced complementary signals.

With reference to FIG. 4, a possible architecture for fully balanced complementary signals will now be described.

The architecture 400 includes block 404 that receives the input clock signal A on input line 402 and outputs signals denoted "A_buf_rise_match" on line 408 and "A_bar_rise_match" on line 410. Block 404 is equivalent to the circuit 200 that has previously been described with reference to FIG. 2. The "A_buf_rise_match" output on line 408 is equivalent to the second trigger signal A_BUF shown in FIG. 2. Similarly, the A_bar_rise_match" output on line 410 is equivalent to the first trigger signal A_BAR shown in FIG. 2.

In addition to block 404 providing matched rising clock edge signals, the architecture 400 further includes block 406 that provides matched falling clock edge signals by way of the circuit modification to FIG. 2 described above. Block 404 receives the input clock signal A on input line 402 and outputs signals denoted A_buf_fall_match on line 412 and A_bar_fall_match on line 414.

Multiplexer 416 receives the inputs A_buf_rise_match on line 408 and A_buf_fall_match on line 412 and the input clock signal A on the control input to line line 403. Multiplexer 416 outputs one of these inputs as a trigger signal denoted "A_buffer" on output line 420.

Multiplexer 418 receives the inputs A_bar_rise_match on line 410 and A_bar_fall_match on line 414 and the input clock signal A on the control input line 403. Multiplexer 418 outputs one of these inputs as a trigger signal denoted "A_bar" on output line 422.

The trigger signals A_buffer on output line 420 and A_bar on output line 422 are complimentary signals in that when A_buffer is logic '0' otherwise referred to as 'low', A_bar is logic '1' otherwise referred to as 'high' and when A_buffer is high A_bar is low.

When the input clock signal A on input line 402 and control input line 403 is low the multiplexer 416 passes A_buf_fall_match that is input on line 412 through the multiplexer 416 and outputs the A_buf_fall_match on output line 420. When the input clock signal A on input line 402 and control input line 403 is logic '0' the multiplexer 418 passes the A_bar_fall_match signal that is input on line 414 through the multiplexer 418 and outputs the A_bar_fall_match signal on output line 422.

When the input clock signal A on input line 402 and control input line 403 is high the multiplexer 416 passes A_buf_rise_match that is input on line 408 through the multiplexer 416 and outputs the A_buf_rise_match on output line 420. When the input clock signal A on input line 402 and control input line 403 is logic '1' the multiplexer 418 passes the A_bar_rise_match signal that is input on line 410 through the multiplexer 418 and outputs the A_bar_rise_match signal on output line 422.

In operation, the delay (t4) between a falling clock edge of the signal A_buffer on output line 420 and a falling input clock edge A that is input on lines 402 and on the multiplexer control input lines 403 is substantially equal to a delay (t3) between a falling clock edge of the signal A_bar on output line 422 and a rising input clock edge A that is input on lines 402 and on the multiplexer control input lines 403.

Furthermore, the delay ($t_2$) between a rising clock edge of the signal A_buffer on output line 420 and a input rising clock edge A that is input on lines 402 and on the multiplexer control input lines 403 is substantially equal to a delay (t1) between a rising clock edge on the signal A_bar on output line 422 and a falling input clock edge A that is input on lines 402 and on the multiplexer control input lines 403

By the application of the architecture 400, the timing differences between the rising and falling edges of a clock signal created by the inverter 103 can be reduced.

It will be appreciated that the architecture 400 shown in FIG. 4 is one of many possible implementations to get fully balanced complementary signals based on the circuits described herein.

Furthermore it will be appreciated that circuit 100 is only one possible application of the example architecture 400. The example architecture 400 shown in FIG. 4 may be suitable for a wide variety of applications, for example in consumer electronics such as set-top boxes, DVD players, handheld computers and mobile telephones.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit for processing a clock signal including first and second clock edges of different polarities, the circuit comprising:
    an inverter for inverting a first clock edge to generate an inverted first clock edge and inverting a second clock edge to generate an inverted second clock edge;
    a first pass gate for receiving the inverted first clock edge and outputting a first trigger signal of a first polarity; and
    a second pass gate for receiving the second clock edge and outputting a second trigger signal of the first polarity, wherein the second pass gate is controlled to open responsive to the inverted second clock edge;
    whereby the delay between the first clock edge and the first trigger signal is substantially equal to the delay between the second clock edge and second trigger signal.

2. A circuit according to claim 1, wherein each of the first and second pass gates comprise a complementary pair of transistors connected in parallel.

3. A circuit according to claim 1, wherein a PMOS transistor of the first pass gate is supplied with a first voltage level at its gate terminal that opens the PMOS transistor, and an NMOS transistor of the first pass gate is supplied with a second voltage level at its gate terminal that opens the NMOS transistor.

4. A circuit according to claim 1, wherein a PMOS transistor of the second pass gate is supplied at its gate terminal with the output of said inverter and an NMOS transistor of the second pass gate is supplied with the second voltage level at its gate terminal that opens the NMOS transistor.

5. A circuit according to claim 1, wherein a NMOS transistor of the second pass gate is supplied at its gate terminal with the output of said inverter and a PMOS transistor of the second pass gate is supplied with the first signal at its gate terminal that turns the PMOS transistor on.

6. A circuit according to claim 3, wherein the first and second trigger signals are rising edges if the second clock edge is a rising edge.

7. A circuit according to claim 1, wherein the circuit further comprises buffer circuitry configured to supply the clock edges to said inverter.

8. A circuit according to claim 1, wherein the circuit further comprises buffer circuitry configured to receive the first trigger signal and buffer circuitry configured to receive the second trigger signal.

9. A circuit according to claim 7, wherein the buffer circuitry comprises an even number of inverters.

10. A circuit according to claim 8, wherein the buffer circuitry comprises an even number of inverters.

11. A circuit according to claim 1, wherein said delay is in the order of picoseconds.

12. A method of processing a clock signal including first and second clock edges of different polarities, the method comprising:

inverting a first clock edge to generate an inverted first clock edge and passing the inverted clock edge through a first pass gate to output a first trigger signal of a first polarity;

inverting a second clock edge to generate an inverted second clock edge; and supplying the second clock edge to a second pass gate to output a second trigger signal of the first polarity, wherein the second pass gate is controlled to open responsive to the inverted second clock edge;

whereby the delay between the first clock edge and the first trigger signal is substantially equal to the delay between the second clock edge and the second trigger signal.

13. A method according to claim 12, wherein the first polarity is the same as the polarity of the second clock edge.

14. A method according to claim 12, wherein the first polarity is the same as the polarity of the first clock edge.

* * * * *